United States Patent [19]
Kawashima

[11] Patent Number: 5,453,704
[45] Date of Patent: Sep. 26, 1995

[54] SENSE AMPLIFIER WITH POSITIVE FEEDBACK AND SELF-BIASING TO ACHIEVE FULL VOLTAGE SWING

[75] Inventor: Shoichiro Kawashima, Kawasaki, Japan

[73] Assignee: Fujitsu Limited, Kawasaki, Japan

[21] Appl. No.: 142,928

[22] Filed: Oct. 29, 1993

[30] Foreign Application Priority Data

Oct. 30, 1992 [JP] Japan ..................... 4-293103

[51] Int. Cl.$^6$ .............................. H03K 19/0175
[52] U.S. Cl. ................... 326/81; 326/80; 326/31; 326/34; 327/51; 330/100
[58] Field of Search ..................... 307/475, 451, 307/548, 272.1, 496; 330/293, 98, 99, 100; 326/80, 81, 31, 34; 327/51, 312, 185, 65

[56] References Cited

U.S. PATENT DOCUMENTS

| | | | |
|---|---|---|---|
| 4,794,282 | 12/1988 | Colles | 307/475 |
| 4,916,337 | 4/1990 | Leung et al. | 307/475 |
| 4,978,870 | 12/1990 | Chen et al. | 307/475 |
| 5,045,730 | 9/1991 | Cooperman et al. | 307/475 |
| 5,113,097 | 5/1992 | Lee | 307/475 |

OTHER PUBLICATIONS

"3.5ns 0.5μm BiCMOS Register File, Design of 3.5ns 0.5 μm BiCMOS Register File", Watanabe et al, The Institute of Electronics, Information and Communication Engineers, Spring National Convention, C-567, 1992, pp. 5-188.

"A 4-Mb CMOS SRAM with a PMOS Thin-Film-Transistor Load Cell", Ootani et al, IEEE Journal of Solid-State Circuits, vol. 25, No. 5, Oct. 1990, pp. 1082-1092.

Primary Examiner—Edward P. Westin
Assistant Examiner—Stephen Calogero
Attorney, Agent, or Firm—Nikaido, Marmelstein, Murray & Oram

[57] ABSTRACT

A level shift amplifier has first to n th inverters connected in series, with each positive voltage terminal of the first to n th inverter is connected to the first source line. Each negative voltage terminal of the first to (n-2)th inverter is connected to output of the second next inverter, respectively. The negative voltage terminal of the (n-1)th inverter is connected to a part of the output of the n th inverter, and the negative voltage terminal of the n th inverter is connected to the second source line. n pieces of feedback elements are connected between the input and output of each inverter. When a feedback element is established so that the gain of each inverter can be maximized, a self-bias amplifier circuit is composed. All inverters are driven by the self-bias voltage. The fine amplitude signals input to the first inverter become the output voltage of full amplitude between the first and second source lines in the n-th inverter. Also, a positive feedback circuit is composed, and the amplification factor of the level shift amplifier is enhanced.

10 Claims, 9 Drawing Sheets

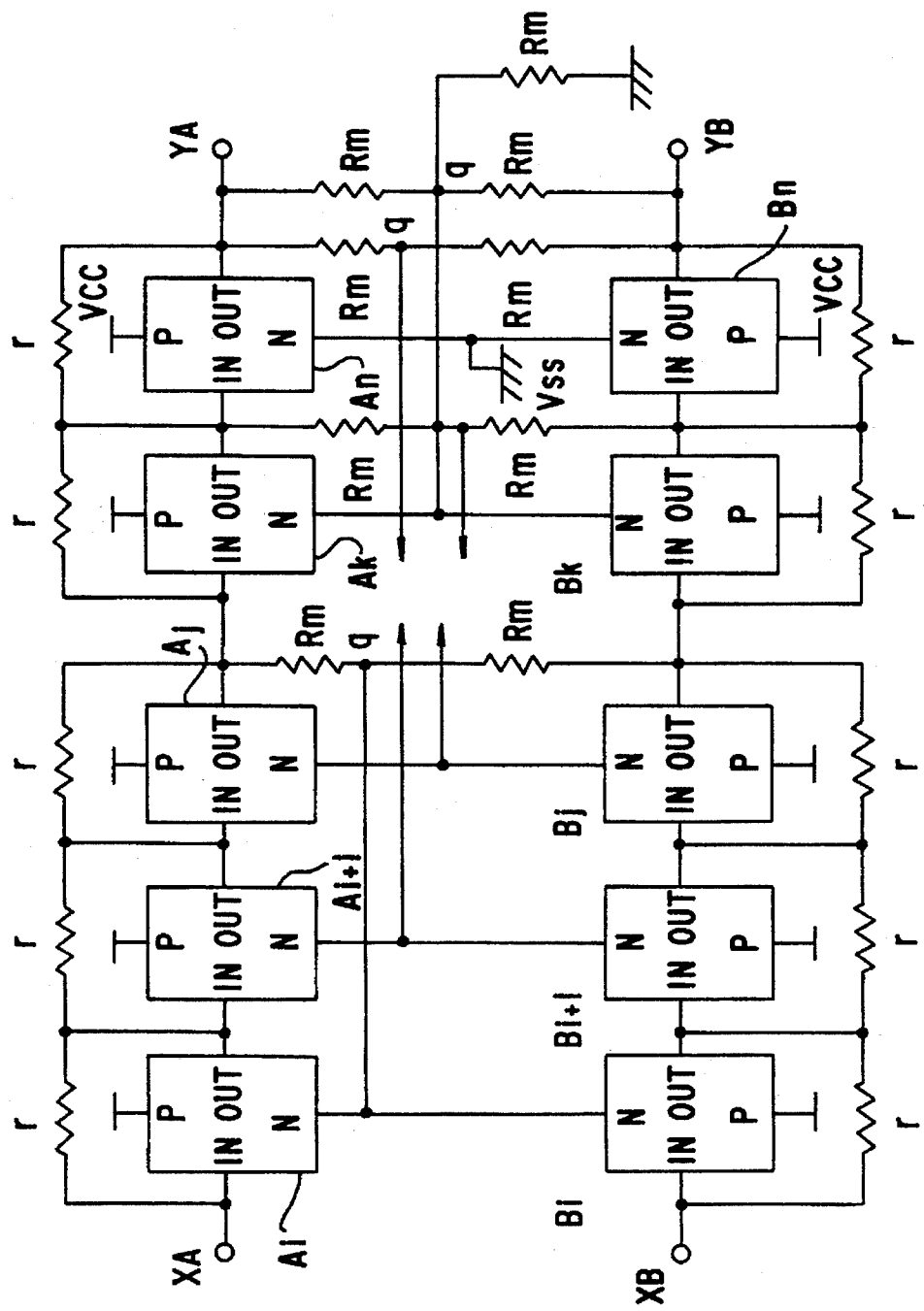

5,453,704

SENSE AMPLIFIER WITH POSITIVE FEEDBACK AND SELF-BIASING TO ACHIEVE FULL VOLTAGE SWING

BACKGROUND OF THE INVENTION

1. Field of the Invention

The present invention relates to a level shift amplifier shifting the fine amplitude voltage to the full amplitude voltage, and more particularly, to an amplifier applicable to a sense amplifier reading the cell output voltage of semiconductor memories.

2. Description of the Related Art

Recently, as required for the high-performance of various information processing devices, sense amplifiers detecting the cell output voltage of semiconductor memories at high speed have been developed.

According to the above development, a latch type sense amplifier amplifying the fine potential difference by shifting its level or a current mirror type sense amplifier reading at high speed the cell output voltage are utilized. However, because the amplification factor of the former amplifier falls unless its input signal is within the specified area, it is not for practical use as a sense amplifier. Also the latter amplifier with its latch function causes to enlarge the signal potential difference, which necessitates the time to reset it.

Prior arts concerning the present invention are described as below. For one example, the level shift amplifier as shown in The Institute of Electronics, Information and Communication Engineers, 1992 Spring National Convention C-567 (hereinafter called "the first level shift amplifier") is applicable to the sense amplifier 4 reading the cell output voltage concerning the semiconductor memory device as shown FIG. 1. The semiconductor memory device comprises a word decoder 1, a memory cell 2, a writing circuit 3 and a sense amplifier 4.

The sense amplifier 4 also comprises a p type field effect transistor TP, n type field effect transistors TN1 and TN2, a CMOS inverter 4B, and a reference voltage source 4A. Transistors TP, TN1, and TN2 connected in series between a source line VCC and a ground line VSS. With the CMOS inverter 4B the output voltage of transistors TP and TN1 is inverted. The reference voltage is supplied by the reference voltage source 4A to the gate of transistor TN2. In general, the input voltage area of CMOS inverter 4B is very small, but its amplification factor is large. Consequently, it is needed to conform the input voltage of CMOS inverter 4B with the output voltage of memory cell 2. The input level of the first level shift amplifier is arranged based on the reference voltage. Thereby, the reference voltage source 4A to supply the reference voltage with the transistor TN2 is needed.

For another example, the level shift amplifier as shown in T.OOTANI, et al., IEEE Journal of SOLID-STATE CIRCUITS, Vol. 25 No. 5 October 1990, pp. 1082–1092 (hereinafter called "the second level shift amplifier") comprises, as shown FIG. 2, a current mirror type sense amplifier 5, a Self-Aligned-Threshold-CMOS-Inverter 6, and p type field effect transistors TP11–TP13.

The current mirror type sense amplifier 5 comprises p type field effect transistors TP51 and TP52, and n type field effect transistors TN51–TN55, and reads the cell output voltage. A Self-Aligned-Threshold-CMOS-Inverter 6 comprises p type field effect transistors TP61 and TP62, and n type field effect transistors TN61–TN65, and amplifies the voltage detected by the sense amplifier 5.

At that point, the current mirror type sense amplifier of the second level shift amplifier has also a level shift function. A transistor TP13 is connected between the power voltage line VCC and the output of sense amplifier 5, and the output voltage of transistors TP52 and TN52 is adapted to the input voltage of Self-Aligned-Threshold-CMOS-Inverter 6.

SUMMARY OF THE INVENTION

An object of the present invention is to have all inverters making level shift operations to be self-bias driving, and to enhance its amplification factor, and thus to amplify its fine potential difference to the output signals of full amplitude.

A further object of the present invention is to devise a method for connecting an terminal at a negative voltage side of said inverter, and to constitute a positive feedback circuit, and thus to enhance the amplification factor of said level shift amplifier.

In a preferred embodiment of the level shift amplifier according to the present invention, as illustrated in FIG. 3, the level shift amplifier comprises the first to n th inverters connected in series, each positive voltage terminal of the first to n th inverter is connected to the first source line, each negative voltage terminal of the first to (n-2)th inverter is connected to output of the second next inverter respectively, the negative voltage terminal of the (n-1)th inverter is connected to a part of the output of the n th inverter, and the negative voltage terminal of the n th inverter is connected to the second source line, and n pieces of feedback elements are connected between the input and output of each inverter.

Thereby, in case of establishing the feedback element so that the gain of each inverter can be maximum, a self-bias amplifier circuit is composed. The output voltage of the third inverter is supplied to the negative voltage terminal of the first inverter, and its ½ voltage is biased near the threshold of the first inverter. The output voltage of the fourth inverter is supplied to the negative voltage terminal of the second inverter, and its ½ voltage is biased near the threshold of the second inverter.

The output voltage of the n-th inverter divided by the bias-element is also supplied to the negative voltage terminal of the n-1 inverter. Thereby, its ½ voltage is biased near the threshold of the n-1 inverter. Further, the potential of the second source line is supplied to the negative voltage terminal of the n-th inverter, thereby, its ½ voltage is biased near the threshold of the n-th inverter.

Thereby, all inverters are driven by the self-bias voltage. The fine amplitude input into the first inverter is to be full amplitude (amplitude between the first and second source lines) output voltage concerning the (n-th) inverter of the last stage. Further, the positive feedback circuit is composed by each inverter, and the amplification factor of said level shift amplifier circuit is enhanced.

BRIEF DESCRIPTION OF THE DRAWINGS

FIG. 5 is a diagram showing the principle of the third level shift amplifier according to the present invention.

DETAILED DESCRIPTION

According to the related art of the present invention, in case of reading the cell output voltage of memory cell at high speed, a sense amplifier detecting its fine potential difference is used. It is because in case of driving bit lines with large voltage, its additional reset time is needed. The bit lines are lines to read the data.

Figure 1:
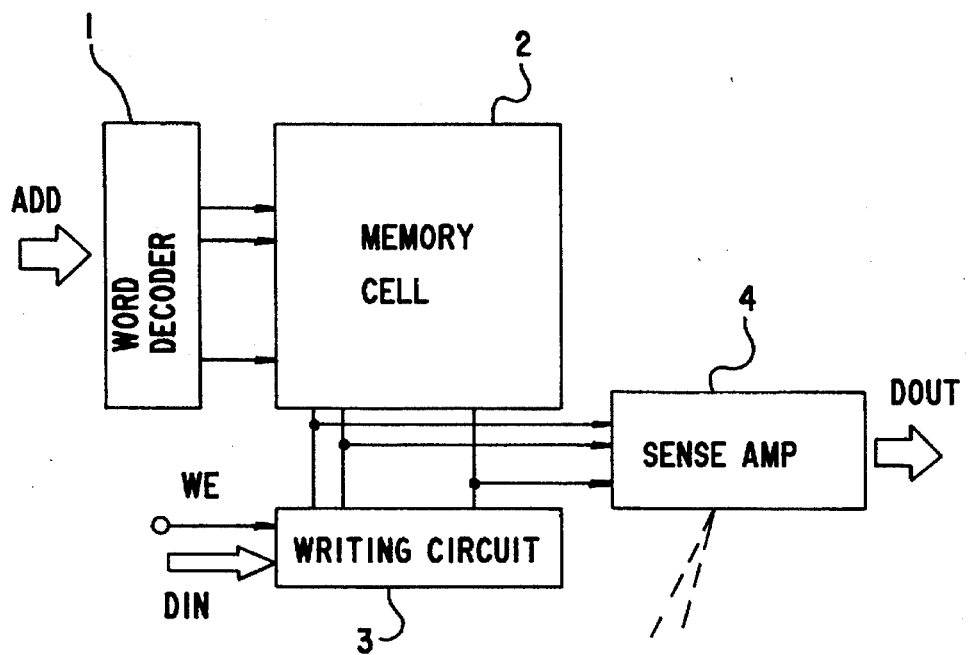
FIG. 1 is a diagram showing the first level shift amplifier according to a prior art.
Figure 1A:
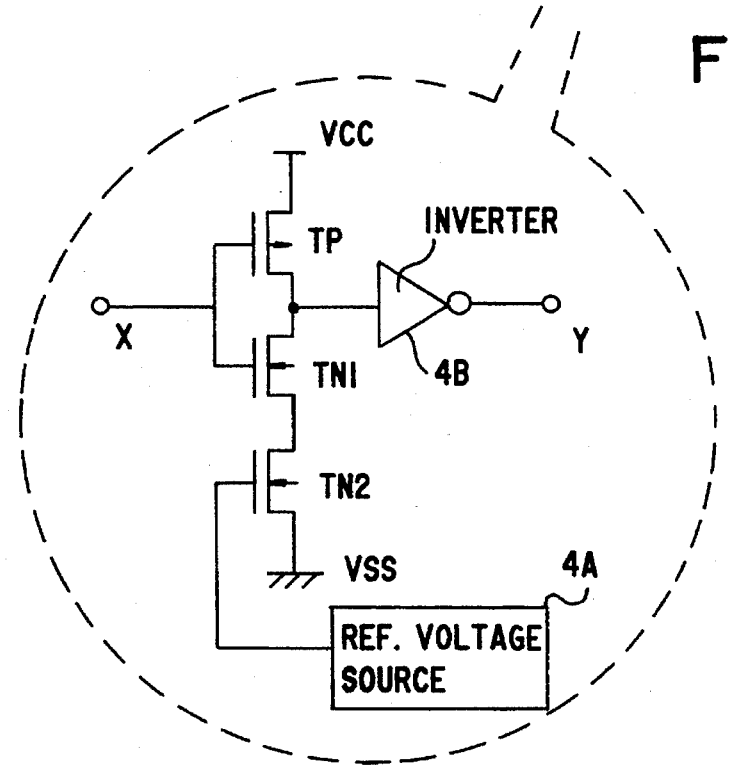
Figure 2:
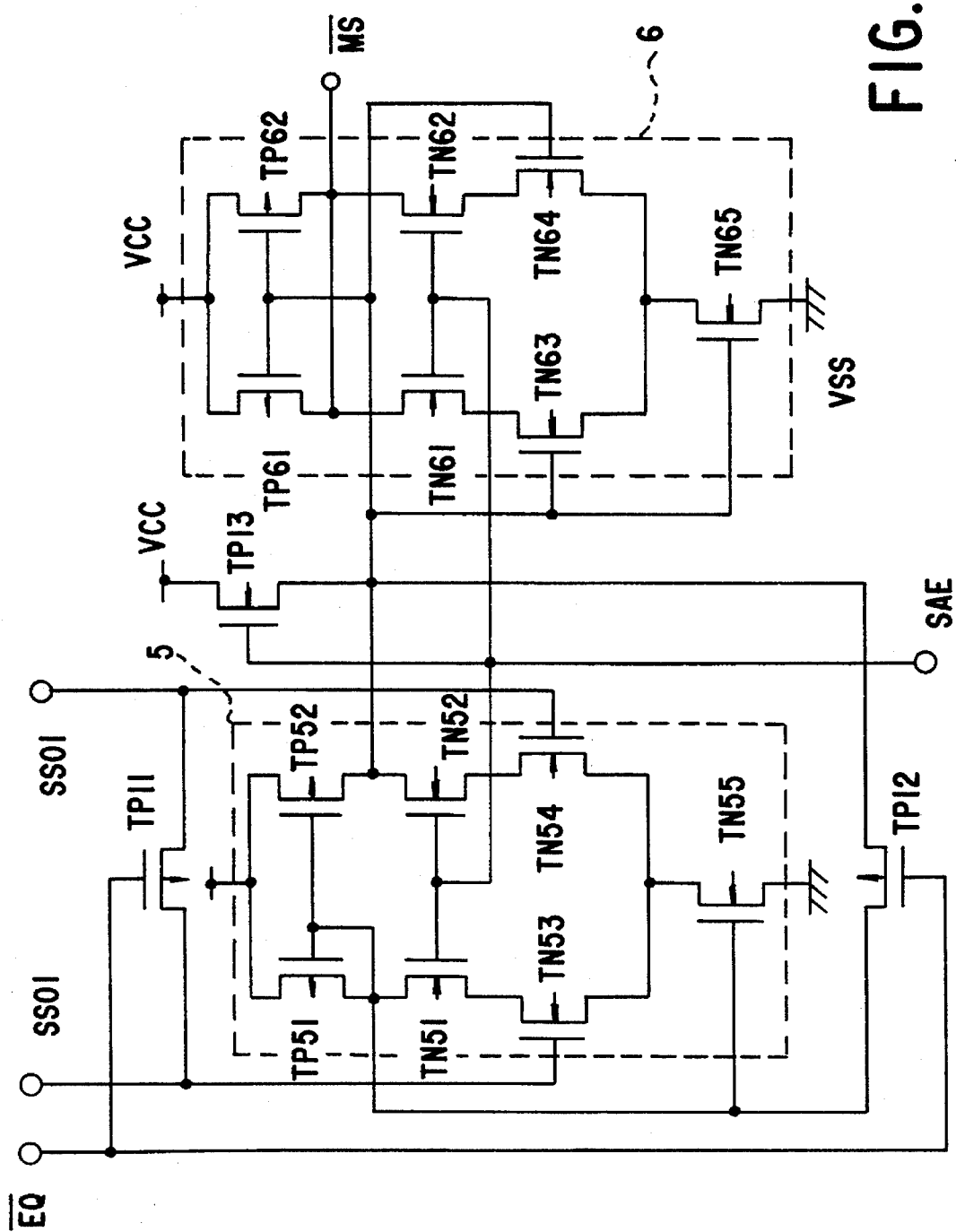
FIG. 2 is a diagram showing the second level shift amplifier according to a prior art.

For example, a latch type sense amplifier and a current mirror type sense amplifier as shown in FIG. 1 and FIG. 2 are applied. However, the current mirror type sense amplifier is not for practical use as a sense amplifier, because its amplification factor is lowered unless the average voltage of its input signal is not over than about VCC−1 [V] and within the limit of VSS+1 [V]. Therefore, VCC is the voltage of source line, VSS is the voltage of ground line. Accordingly, it is needed to connect the level shift circuit to the input of sense amplifier. For this reason, there is a problem of delay time arising in regard to the signal propagation.

Further, the latch function of latch type sense amplifier causes to enlarge the signal potential difference and to necessitate the time to reset it. For this reason, there is a problem of delay in access time arising. In these circuits, CMOS inverter cannot be amplified in full amplitude from the source line VCC to the source line VSS. In generating the reference voltage, the reference voltage source is necessary in addition to the CMOS inverter. The real self-bias drive is not applied.

Further, the CMOS inverter demonstrates its maximum input sensitivity when its input and output are short. This is because the self-bias is driven between the input and output voltages. It is important to set up this output voltage on its input level.

However, the semiconductor memory devices applying the latch type and current mirror type sense amplifiers never operate the amplifiers function well, but rather they disturb its function for high speed reading.

Figure 3:
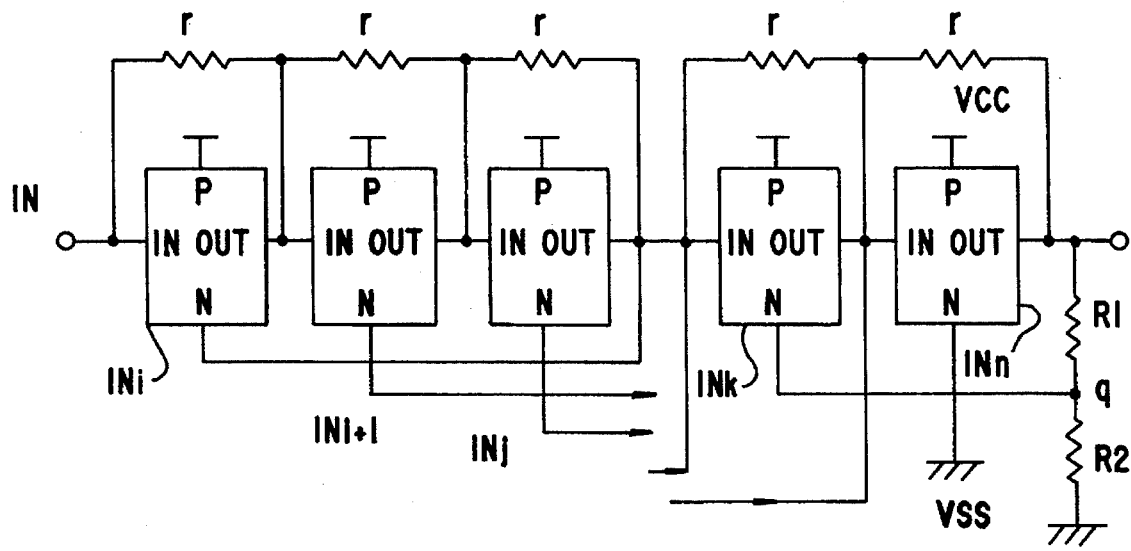
FIG. 3 is a diagram showing the principle of the first level shift amplifier according to the present invention.

Against the above, the first principle level shift amplifier according to the present invention, as shown in FIG. 3, has n pieces of inverter INn [n=i, . . . j, . . . k, n], n pieces of feedback element r, and 2 pieces of bias elements R1 and R2. The first inverter IN1 causes to shift the input voltage to the voltage of full amplitude by receiving the voltage of the first source line VCC and the output voltage of the j-th [j=3] inverter IN3. The second inverter IN2 causes to shift the output voltage of the first inverter IN1 to the voltage of full amplitude by receiving the voltage of the first source line VCC and the output voltage of the j+1 inverter IN [j+1].

The third inverter IN3 causes to shift the output voltage of the second inverter IN2 to the voltage of full amplitude by receiving the voltage of the first source line VCC and the output voltage of the j+2 inverter IN [j+2].

The n−1 inverter IN [n−1] causes to shift the output voltage of the n−2 inverter [n−2] to the voltage of full amplitude by receiving the voltage of the first source line VCC and the divided voltage of output voltage of the n−2 inverter IN [n−2].

The n-th inverter INn causes to shift the output voltage of the n−1 inverter IN [n−1] to the voltage of full amplitude by receiving the voltage of the first source line VCC and the voltage of the second source line VSS.

Further, the second principle level shift amplifier according to the present invention, as shown in FIG. 5, has n pieces of inverters at the positive sequence side An [n=1, 2, j, . . . n], n pieces of inverters at the negative sequence side Bn [n=1, 2, j, . . . n], 2 n pieces of feedback element r, and multiple bias elements Rm [m=1–m]. The first inverter at the positive sequence side A1 causes to shift the input voltage at the positive sequence side to the voltage of full amplitude by receiving the divided voltage of output voltage of the j-th [j=3] inverter at the positive sequence side A3 and output voltage of the j-th [j=3] inverter at the negative sequence side B3, and the voltage of the first source line VCC.

The first inverter at the negative sequence side B1 causes to shift the input voltage at the negative sequence side to the voltage of full amplitude by receiving the divided voltage of output voltage of the j-th [j=3] inverter at the positive sequence side A3 and output voltage of the j-th [j=3] inverter at the negative sequence side B3, and the voltage of the first source line VCC.

The second inverter at the positive sequence side A2 causes to shift the output voltage of the first inverter at the positive sequence side A1 to the output voltage of large amplitude by receiving the divided voltage of the output voltage of the j+1 inverter at the positive sequence side A [j+1] and the output voltage of the j+1 inverter at the negative sequence side B [j+1], and the voltage of the first source line VCC.

The second inverter at the negative sequence side B2 causes to shift the output voltage of the first inverter at the negative sequence side B1 to the output voltage of large amplitude by receiving the divided voltage of the output voltage of the j+1 inverter at the positive sequence side A [j+1] and the output voltage of the j+1 inverter at the negative sequence side B [j+1], and the voltage of the first source line VCC.

The third inverter at the positive sequence side A3 causes to shift the output voltage of the second inverter at the positive sequence side A2 to the voltage of full amplitude by receiving the divided voltage of output voltage of the j+2 inverter at the positive sequence side A [j+2] and output voltage of the j+2 inverter at the negative sequence side B [j+2], and the voltage of the first source line VCC.

The third inverter at the negative sequence side B3 causes to shift the output voltage of the second inverter at the negative sequence side B2 to the voltage of full amplitude by receiving the divided voltage of output voltage of the j+2 inverter at the positive sequence side A [j+2] and output voltage of the j+2 inverter at the negative sequence side B [j+2], and the voltage of the first source line VCC.

The n−1 inverter at the positive sequence side A [n−1] causes to shift the output voltage of the n−2 inverter at the positive sequence side A [n−2] to the voltage of full amplitude by receiving the divided voltage of output voltage of the n-th inverter at the positive sequence side An and output voltage of the n-th inverter at the negative sequence side Bn, and the voltage of the first source line VCC.

The n−1 inverter at the negative sequence side B [n−1] causes to shift the output voltage of the n-2 inverter at the negative sequence side B [n−2] to the voltage of full amplitude by receiving the divided voltage of output voltage of the n-th inverter at the positive sequence side An and output voltage of the n-th inverter at the negative sequence side Bn, and the voltage of the first source line VCC.

The n-th inverter at the positive sequence side An causes to shift the output voltage of the n−1 inverter at the positive sequence side A [n−1] to the voltage of full amplitude by receiving the voltage of the first source line VCC and the voltage of the second source line VSS.

The n-th inverter at the negative sequence side Bn causes to shift the output voltage of the n−1 inverter at the negative sequence side B [n−1] to the voltage of full amplitude by receiving the voltage of the first source line VCC and the voltage of the second source line VSS.

Figure 4:
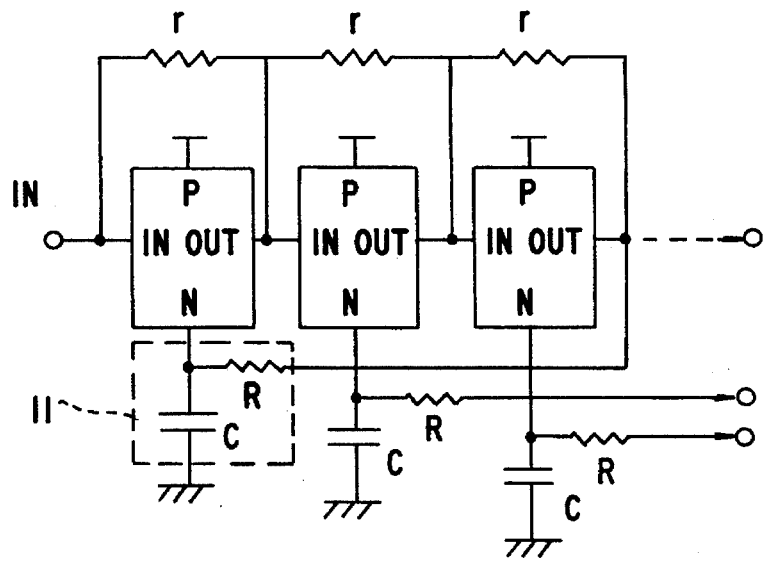
FIG. 4 is a diagram showing the principle of the second level shift amplifier according to the present invention.

Further, the third principle level shift amplifier according to the present invention, in regard to the first and second level shift amplifiers according to the present invention, wherein a smoothing circuit 11 is connected between the negative voltage terminals (source or emitter) N of the i-th [i=1] inverter INi, Ai, Bi and the output of the i+2 inverter Inj, Aj, Bj, so that the output voltage can be stable DC, as illustrated in FIG. 4.

Figure 6A:
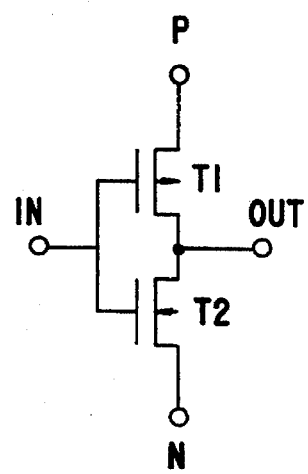
FIG. 6(A) is a diagram showing the principle of inverters of the first, second and third level shift amplifiers as shown in FIG. 3–FIG. 5. The inverters indicate complementary field effect transistor circuits.
Figure 6B:
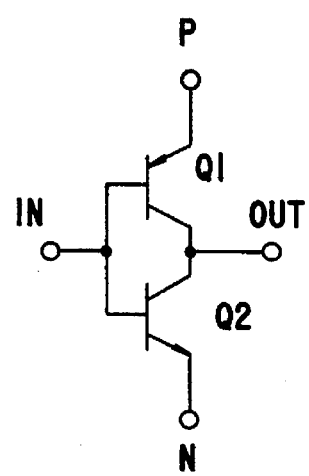
FIG. 6(B) is a diagram showing the principle of other inverters of the first, second and third level shift amplifiers as shown in FIG. 3–FIG. 5. The inverters indicate bipolar transistor circuits.

Moreover, the first, second and third level shift amplifiers according to the present invention are characterized by their inverters INn, An, Bn comprising field effect transistors T1 and T2, or bipolar transistors Q1 and Q2, as illustrated in FIG. 6(A) and FIG. 6(B).

Next, the operations of the first principle level shift amplifier according to the present invention are described as below. For example, when a feedback element r is set up so that the gain of each inverter INn can be maximized, a self-bias amplifier circuit is composed. Also, by supplying the output voltage of the third inverter IN3 to the negative voltage terminal N of the first inverter IN1, its ½ voltage is biased near the threshold of said inverter IN1. Further, by supplying the output voltage of the fourth inverter IN4 to the negative voltage terminal N of the second inverter IN2, its ½ voltage is biased near the threshold of the second inverter IN2.

Further, by supplying the output voltage of the n-th inverter INn divided by bias elements R1 and R2 to the negative voltage terminal N of the n−1 inverter INk, its ½ voltage is biased near the threshold of said inverter INk. Also, by connecting the negative voltage terminal N of the n-th inverter INn to the second source line VSS, its ½ voltage is biased near the threshold of said Inverter INn.

Thereby, all inverters INI—INn are driven by the self-bias voltage, and to output through the last stage (the n-th) inverter Inn the signals of fine amplitude input into the first inverter IN1, the output voltage equivalent to the voltage amplitude between the first source line VCC and the second source line VSS is obtainable. Also, by the method for connecting the negative voltage terminal N of each inverter Inn, a positive feedback circuit is composed, and thus the amplification factor of said amplifier circuit can be enhanced.

The operations of the second principle level shift amplifier according to the present invention are described as below.

For example, when a feedback element r is established so that the gain of inverter An at the positive sequence side and the gain of inverter Bn at the negative sequence side can be maximized, a self-bias amplifier circuit is composed. Also, the voltage dividing the output voltage of the third inverters A3 and B3 by the bias element Rm is supplied to the negative voltage terminal N of the first inverters A1 and B1. Thereby, its ½ voltage is biased near the threshold of the first inverters A1 and B1.

Further, the voltage dividing the output voltage of the fourth inverters A4 and B4 by the bias element Rm is supplied to the negative voltage terminal N of the second inverters A2 and B2. Thereby, its ½ voltage is biased near the threshold of the second inverters A2 and B2.

Also, the voltage dividing the output voltage of the n-th inverters An and Bn by the bias element Rm is [k=n−1] supplied to the negative voltage terminal N of the k-th inverters Ak and Bk. Thereby, its ½ voltage is biased near the threshold of said inverters Ak and Bk. Moreover, by connecting the negative voltage terminal N of the n-th inverters An and Bn to the second source line VSS, its ½ voltage is biased near the threshold of said inverters An and Bn.

Thereby, all inverters Al–An, B1–Bn are driven by the self-bias voltage, and to output through the last stage (the n-th) inverters An and Bn the complementary signals of fine amplitude input into the first inverters A1 and B1, the complementary output voltage of full amplitude is obtainable. Also, by the method for connecting the negative voltage terminal N according to the present invention similar to the first level shift amplifier, a positive feedback circuit is composed, the amplification factor of said complementary level shift amplifier can be enhanced.

Next, the operations of the third principle level shift amplifier according to the present invention are described as below. For example, the output voltage of the i+2 inverter Inj becomes smooth by means of capacitance C and resistance R, its output voltage can be supplied to the negative voltage terminal N of the i-th inverter Ini.

Thereby, supplying bias voltage to each of inverters IN1-Ink is stabilized, and thus a level shift amplifier of high reliability can be composed.

DESCRIPTION OF THE FIRST EMBODIMENT OF THE PRESENT INVENTION

Figure 7:
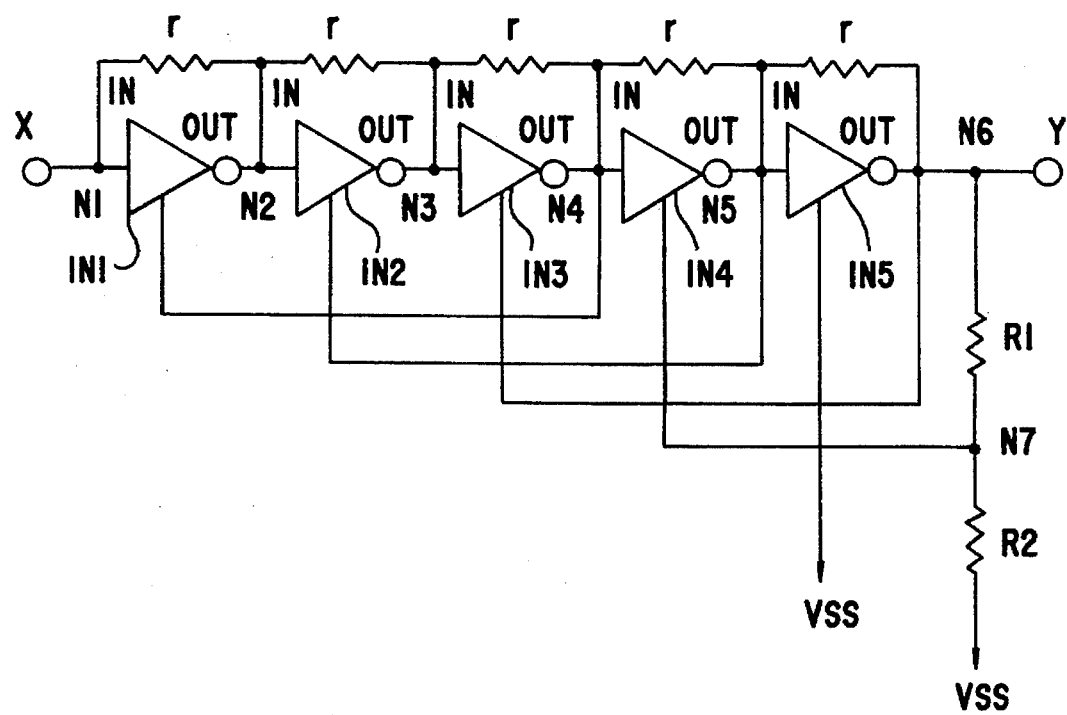
FIG. 7 is a diagram showing a circuit composition of the first preferred embodiment of level shift amplifier according to the present invention.

For example, a level shift amplifier preferable for a sense amplifier to read data from memories, as shown in FIG. 7, has 5 pieces of inverters IN1–IN5, 5 pieces of feedback resistances r, and 2 pieces of bias resistances R1 and R2.

Figure 8A:
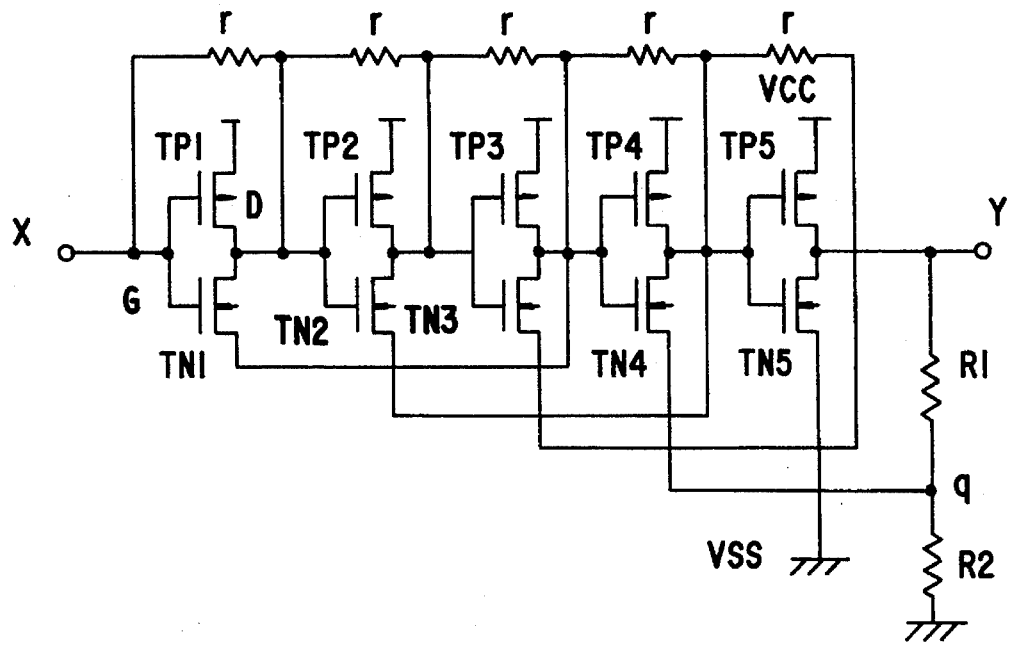
FIG. 8(A) is a diagram composed by complementary field effect transistor circuits of the first preferred embodiment of inverter of the level shift amplifier according to the present invention.

Namely, 5 pieces of inverters IN1–IN5 are one example of the n pieces of inverters Inn, and the example in case of n=5. The inverters IN1–IN5, as illustrated in FIG. 8(A), comprise n type field effect transistors TN1–TN5, and p type field effect transistors TP1–TP5. For example, the sources of transistors TP1–TP5 to be the terminal P at each of the positive voltage sides of 5 pieces of inverters IN1–IN5 are connected to the first source line (hereinafter called the "source line") VCC, and the first-fifth inverters IN1–IN5 are connected in series (cascade connection).

Further, the source of transistor TN1 to be the negative voltage terminal N of the first inverter IN1 is connected to the output of the third inverter IN3, and the source of transistor TN2 of the second inverter IN2 is connected to the output of the fourth inverter IN4. Also, the source of transistor TN3 of the third inverter IN3 is connected to the output of the fifth inverter IN5.

The source of transistor TN4 of the fourth inverter IN4 is connected to the junction point q of the series resistances R1 and R2, and the source of transistor TN5 of the fifth inverter IN5 is connected to the second source line (hereinafter called the "ground line") VSS.

Figure 8B:
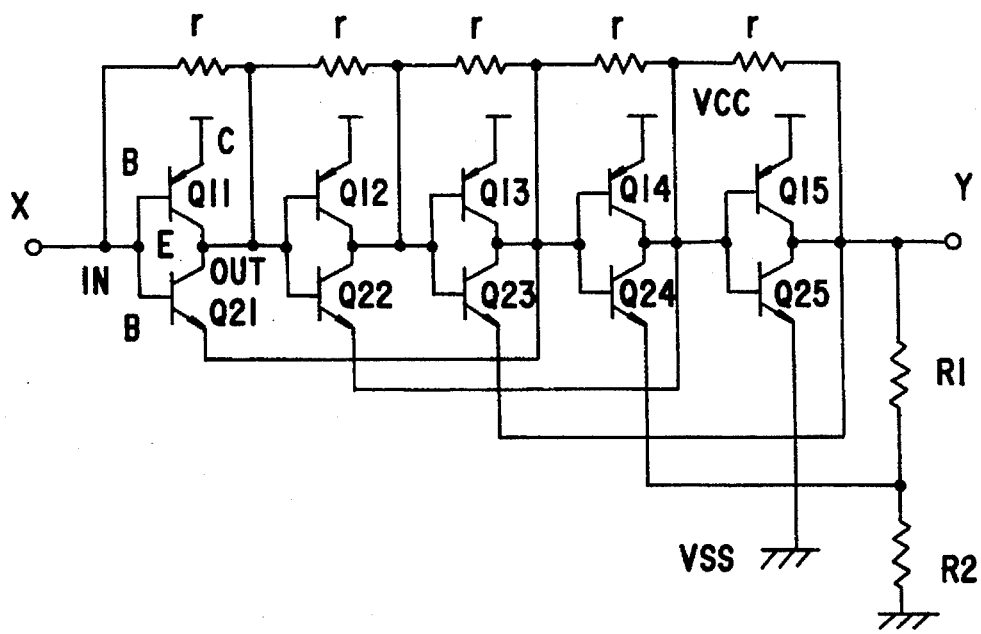
FIG. 8(B) is a diagram composed by complementary bipolar transistor circuits of the first preferred embodiment of inverter of the level shift amplifier according to the present invention.

Further, the inverters IN1–IN5 may, as shown in FIG. 8(B), comprise pnp type bipolar transistors Q11–Q15 and npn type bipolar transistors Q21–Q25. For example, as illustrated in FIG. 8(B), the collectors of pnp type and npn type bipolar transistors are connected each other, and then connected to the output of said inverter, each emitter of them is connected to the source line VCC and the ground line VSS, their bases are connected each other and then connected to the input of said inverter.

5 pieces of feedback resistances r are one example of n pieces of feedback elements r, and are connected between the input and output of each of inverters IN1–IN5. For example, the feedback resistance r is connected between the gate and drains of CMOS inverter comprising the transistor TN1 and the transistor TP1.

The feedback resistance r is connected between the bases and emitters of complementary transistors comprising the bipolar transistor Q11 and bipolar transistor Q21. Between the input and output of each of the other 4 pieces of inverters IN2–IN5, a feedback resistance r is connected similarly.

Further, 2 pieces of bias resistances R1 and R2 are one example of the bias elements R1 and R2, and are connected in series, and then connected between the output of the fifth inverter IN5 and the ground line VSS. The junction point of these series resistances R1 and R2 is q, the resistance ratio of said bias resistances R1 and R2 is set up at a value so that the voltage at the junction point q can be $1/\sqrt{2}$ (VCC−VSS).

Figure 9A:
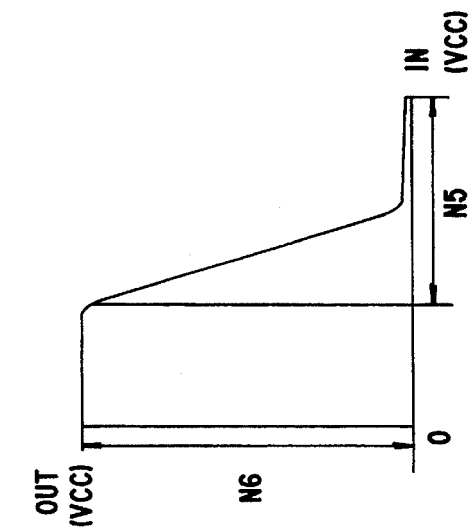
FIG. 9(A) is a diagram showing input-output voltage characteristics of the operations of level shift amplifier (N1→N3) as shown in FIG. 8(A).

Next, the operations of this embodiment are described as below. As illustrated in FIG. 7, N1–N7 are the signal level of each of the nodes. For example, the signal level N1 becomes an input level of the first inverter IN1, i.e. the level depending on the cell output voltage to read from the memory cells, etc. Also, the signal level N2 becomes the output level of the first inverter IN1, and the input level of the second inverter IN2 as showing the input-output voltage characteristics of inverter in FIG. 9(A). Further, the signal level N3 becomes the output level of the second inverter IN2, and also the input level of the third inverter IN3.

Figure 9B:
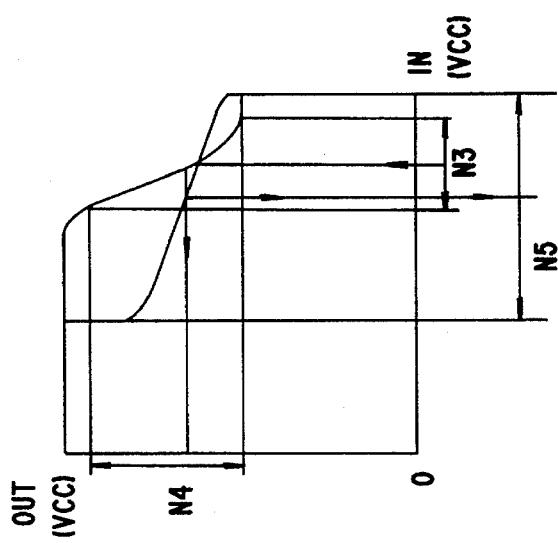
FIG. 9(B) is a diagram illustrating input-output voltage characteristics of the operations of level shift amplifier (N3→N5) as shown in FIG. 8(A).

Similarly, the signal level N4 becomes the output level of the third inverter IN3, and also the input level of the fourth inverter IN4 as showing the input-output voltage characteristics of inverter in FIG. 9(B). The signal level N5 becomes the output level of the fourth inverter IN4, and also the input level of the fifth inverter IN5.

Figure 9C:
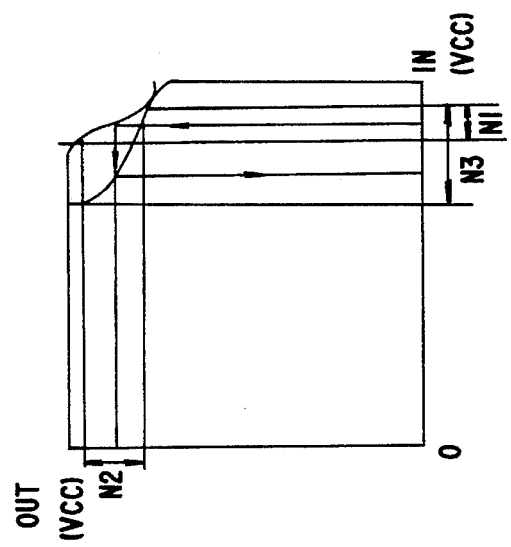
FIG. 9(C) is a diagram showing input-output voltage characteristics of the operations of level shift amplifier (N5→N6) as shown in FIG. 8(A).

Moreover, the signal level N6 becomes the output level of the fifth inverter IN5 as showing the input-output voltage characteristics of inverter in FIG. 9(C). The signal level N7 becomes the signal level at the junction point q of the series resistances R1 and R2, and the voltage dividing the output voltage of the fifth inverter IN5 by the bias resistances R1 and R2.

Figure 10:
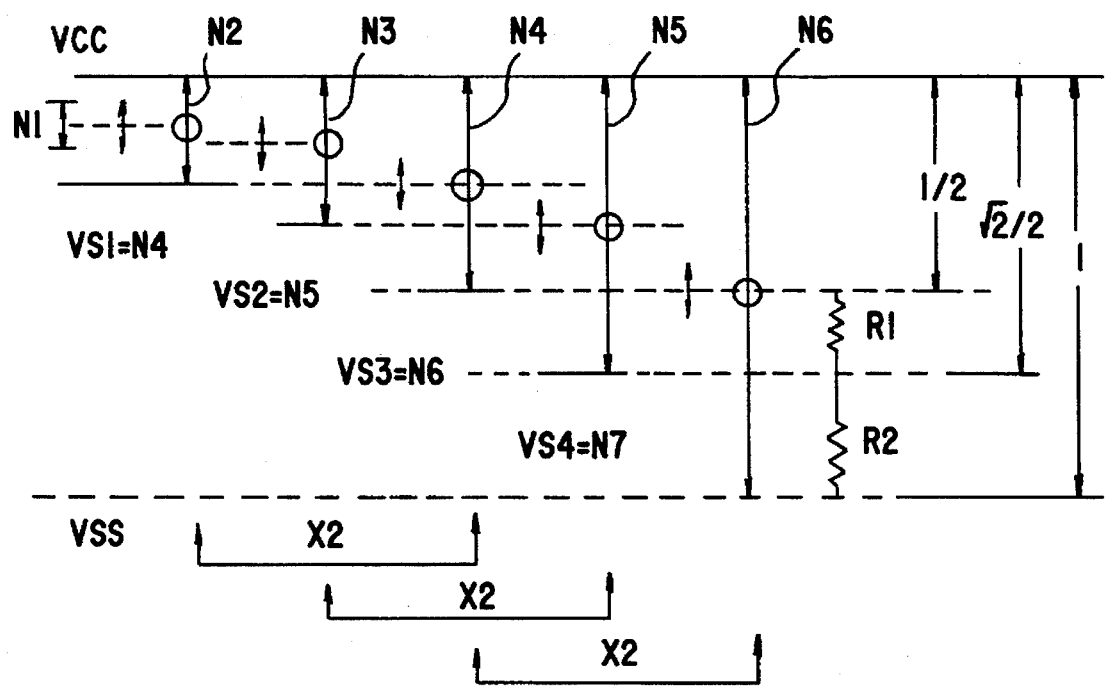
FIG. 10 is a diagram showing amplitude shifting conditions of the first preferred embodiment of level shift amplifier according to the present invention.

When fine signals of input voltage N1 are input into the first inverter IN1, the voltage VS1/2 is biased near the threshold of inverter IN1, as shown in FIG. 10 showing the amplitude shift conditions. This is because the output voltage N4=about VCC/4 of the third inverter IN3 is supplied to the source of transistor TN1 of the first inverter IN1. Thereby, the voltage of fine signals N1 is shifted $\sqrt{2}$ times.

Further, the voltage VS2/2 is biased near the threshold of the second inverter IN2, as shown in FIG. 10. This is because the output voltage N5=about VCC$\sqrt{2}$/4 of the fourth inverter IN4 is supplied to the source of transistor TN2 of the second inverter IN2. Thereby, the output voltage N2 of the first inverter is shifted $\sqrt{2}$ times.

Also, the voltage VS3/2 is biased near the threshold of the third inverter IN3, as shown in FIG. 10. This is because the output voltage N6=about VCC/2 of the fifth inverter IN5 is supplied to the source of transistor TN3 of the third inverter IN3. Thereby, the output voltage N6 of the second inverter IN2 is shifted $\sqrt{2}$ times. At that time, compared with the amplitude of output voltage N2, the output voltage N4 of twice amplitude is obtained.

Similarly, the voltage VS4/2 is biased near the threshold of inverter IN4 as shown in FIG. 10. This is because the output voltage N7=about VCC$\sqrt{2}$/2 of the fifth inverter IN5 divided by the bias resistances R1 and R2 is supplied to the source of transistor TN4 of the fourth inverter IN4. Thereby, the output voltage N4 of the third inverter IN3 is shifted $\sqrt{2}$ times. At that time, compared with the amplitude of output voltage N3, the output voltage N5 of twice amplitude can be obtained.

Further, the voltage of ground line VSS/2 is biased near the threshold of inverter IN5, as shown in FIG. 10. This is because the source of transistor TN5 of the fifth inverter IN5 is connected to the ground line VSS. Thereby, the output voltage of the fourth inverter IN4 is shifted $\sqrt{2}$ times. At that time, compared with the amplitude of output voltage N4, the output voltage N6 of twice amplitude can be obtained.

For this reason, the fine signals of input voltage N1 input into the first inverter IN1 is concerning the output of the fifth inverter IN5, and become the output voltage of full amplitude.

Such being the case, the level shift amplifier according to the first embodiment of the present invention have 5 pieces of inverters IN1–IN5, 5 pieces of feedback elements r, and 2 pieces of bias resistances R1 and R2, as illustrated in FIG. 7.

Therefore, a feedback resistance r=several is established so that the gain of each of the inverters IN1–IN5 can be maximized, a self-bias amplifier circuit is composed.

Thereby, all inverters IN1–IN5 are driven by the self-bias voltage, the input level of the first inverter IN1. For example, the output level of memory cell can be gradually amplified in the level shift, and can be finally fully swung to the voltage of source line VCC and ground line VSS.

Also, by dividing the method for connecting the source of transistor TN5 of each of the inverters IN1–IN5 according to this embodiment, a positive feedback circuit is composed, the amplification factor of said amplifier circuit can be advanced. For this reason, in comparison with the level shift amplifier obtaining high gains by only means of one unit, the level shift amplifier according to this embodiment causes to advance the frequency response against switching the input, and thus the level shift operations at high speed is available.

DESCRIPTION OF THE SECOND EMBODIMENT OF THE PRESENT INVENTION

Figure 11:
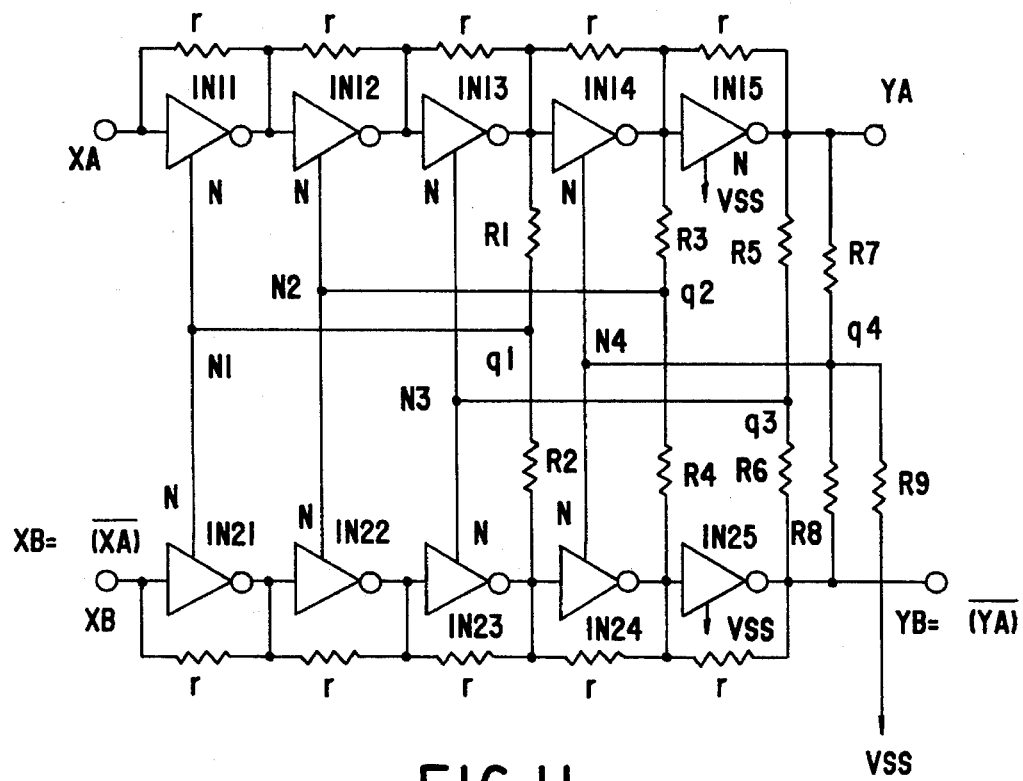
FIG. 11 is a diagram showing a composition of the second preferred embodiment of level shift amplifier according to the present invention.

Differently from the first embodiment, the level shift amplifier according to the second embodiment of the present invention, as illustrated in FIG. 11, has an inverter circuit at the positive sequence side and an inverter circuit at the negative sequence side, and causes to output complementary input signals by shifting the level.

The level shift amplifier preferable for an amplifier reading complementary data from memories comprises 5 pieces of inverters at the positive sequence side IN11–IN15, 5 pieces of inverters at the negative sequence side IN21–IN25, 10 pieces of feedback resistances r, and 9 pieces of bias resistances R1–R9, as shown in FIG. 11.

5 pieces of inverters at the positive sequence side IN11–IN15 are one example of the n pieces of inverters at the positive sequence side, the one in case of n=5. Also, for the terminal at each positive voltage side P of 5 pieces of inverters IN11–IN15, for example, when said inverters IN are composed of field effect transistors, the source of p type field effect transistors are connected to the source line VCC. Moreover, when said inverters IN are composed of bipolar transistors, the emitters of pnp type bipolar transistors are connected to the source line VCC.

Similarly, the 5 pieces of inverters at the negative sequence side IN21–IN25 are one example of the n pieces of inverters Bn, and the one in case of n=5. Also, the source of 5 pieces of inverters IN21–IN25 at each positive voltage side is connected to the source line VCC. Moreover, when said inverters are composed of bipolar transistors, the emitters of npn type bipolar transistors are connected to the ground line VSS.

Further, the first through fifth inverters IN11–IN15 amplifying signals at the positive sequence side are connected in series. Also, the first through fifth inverters IN21–IN25 amplifying signals at the negative sequence side are connected in series.

The terminal at each negative voltage side N of the first through fourth inverters at the positive sequence side IN11–IN14 are connected each to the terminal at each negative voltage side N of the first through fourth inverters at the negative sequence side IN21–IN24. This junction points are N1–N4. The junction point N1 is connected to the junction point q1 between the series resistances R1 and R2. The junction point N2 is connected to the junction point q2 between the series resistances R3 and R4. The junction point N3 is connected to the junction point q3 between the series resistances R5 and R6. The junction point N4 is connected to the junction point q4 of series resistances R7 and R8 respectively. The negative voltage terminal N of the fifth inverter at the positive sequence side IN15 and the negative voltage terminal N of the fifth inverter at the negative sequence side IN25 are connected to the ground line VSS. The feedback resistances r are connected between the input and output of the inverters IN11–IN15 at each positive sequence side and of the inverters IN21–IN25 at each negative sequence side, similarly to the first embodiment. Also, the resistance r=several is established so that the gains of inverters IN11–IN15 at the positive sequence sides and of the inverters IN21–IN25 at the negative sequence sides can be maximized.

Further, 9 pieces of bias resistances R1–R9 are one example of multiple bias elements Rm, and the one in case of m=9. For example, the first and second bias resistances R1 and R2 are connected in series, and then connected between the output of the third inverter IN13 and the output of the inverter IN23. This junction point is q1.

Also, the third and fourth bias resistances R3 and R4 are connected in series, and then connected between the output of the fourth inverter IN14 and the output of the inverter IN24. This junction point is q2. The fifth and sixth bias resistances R5 and R6 are connected in series, and then connected between the output of the fifth inverter IN15 and the output of the inverter IN25. This junction point is q3.

Further, the seventh and eighth bias resistances R7 and R8 are connected in series, and then connected between the output of the fifth inverter IN15 and the output of the inverter IN25. This junction point is q4. The ninth bias resistance R9 is connected to said junction point q4, and the other end of its resistance R9 is connected to the ground line VSS.

The level shift amplifier according to the second embodiment of the present invention, as illustrated in FIG. 5, has 5 pieces of inverters at the positive sequence sides IN11–N15, 5 pieces of inverters at the negative sequence sides IN21–IN25, and 10 feedback resistances r and 9 pieces of bias resistances R1–R9.

Therefore, when the feedback resistance r is established so that the gain of said level shift amplifier can be maximized, the self-bias amplifier is composed. Also, by supplying the voltage dividing the output voltage of the third inverters IN13 and IN23 by the bias resistances R1 and R2 to the negative voltage terminals N of said inverters IN11 and IN21, its ½ voltage is biased near the threshold of said inverters IN11 and IN21. Further, by supplying the voltage dividing the output voltage of the fourth inverters IN14 and IN24 by the bias resistances R3 and R4 to the negative voltage terminal N of the second inverters IN12 and IN22, its ½ voltage is biased near the threshold of the second inverters IN12 and IN22.

Similarly, by supplying the voltage dividing the output voltage of the fifth inverters IN15 and IN25 by the bias resistances R5 and R6 to the negative voltage terminals N of the third inverters IN13 and IN23, its ½ voltage is biased near the threshold of the third inverters IN13 and IN23.

Also, by supplying the voltage dividing the output voltage of the fifth inverters IN15 and IN25 by the bias resistances R7 and R8 to the negative voltage terminals N of the fourth inverters IN14 and IN24, its ½ voltage is biased near the threshold of said inverters IN14 and IN24. Moreover, by connecting the negative voltage terminals N of the fifth inverters IN15 and IN25 to the ground line VSS, the voltage of ground line VSS/2 is biased near the threshold of said inverters IN15 and IN25.

Thereby, the level shift operations can be done by averaging the output voltage of the inverters from said inverters to the second next inverter by means of bias resistances R1 and R2, R3 and R4, R5 and R6, R7 and R8 respectively.

Therefore, all inverters at the positive sequence sides IN11–IN15, and all inverters at the negative sequence sides IN21–IN25 are driven by the self-bias voltage. The complementary fine amplitude signals input into the first inverter at the positive sequence side IN11 and the inverter at the negative sequence side IN21 can be the complementary output voltage of full amplitude by receiving the output of the fifth inverter at the positive sequence side IN11 and the inverter at the negative sequence side IN25.

Also, by connecting the negative voltage terminals N of each of the inverters at positive sequence sides IN11–IN15 and the inverters at the negative sequence sides IN21–IN25 are connected each other, a positive feedback circuit is composed, similarly to the first embodiment of the present invention, the amplification factor of said amplifier circuit can be enhanced.

DESCRIPTION OF THE THIRD EMBODIMENT OF THE PRESENT INVENTION

Figure 12:
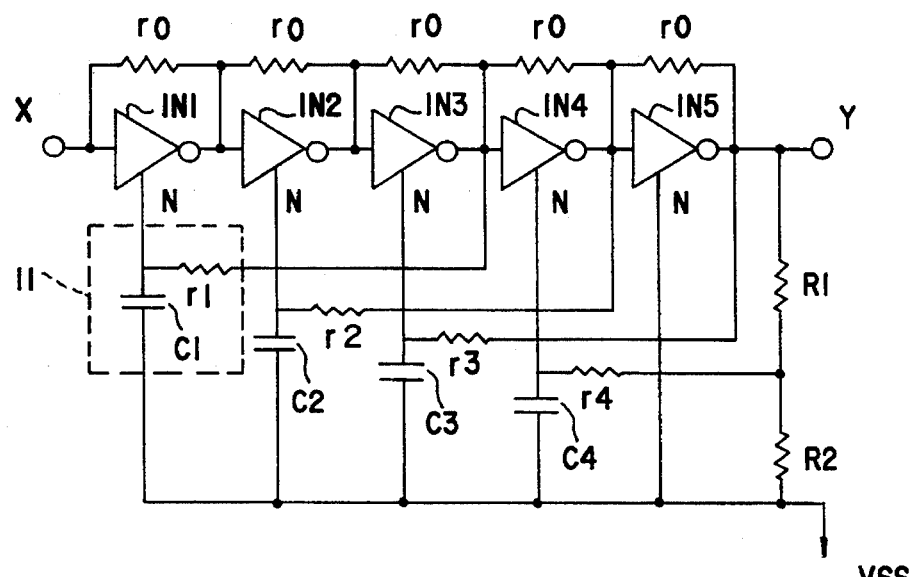
FIG. 12 is a diagram showing a composition of the third preferred embodiment of level shift amplifier according to the present invention.

Differently from the first and second embodiments, the level shift amplifier according to the third preferable embodiment of the present invention comprises a smooth circuit 11 connected, as illustrated in FIG. 12. For example, as a modified type of the level shift amplifier according to the first embodiment as illustrated in FIG. 12, a smooth circuit 11 is connected between the negative voltage terminal N of the first inverter IN1 and the output of the third inverter IN3. Also, the smooth circuit 11 comprises the resistance R1 of several and the capacitance C1 of the several, subject to the operation frequency.

Similarly, the resistance R2 and the capacitance C2 are connected between the negative voltage terminal N of the second inverter IN2 and the output of the fourth inverter IN4. Also, the resistance R3 and the capacitance C3 are connected between the negative voltage terminal N of the third inverter IN3 and the output of the fifth inverter IN5, and the resistance R4 and the capacitance C4 are connected between the negative voltage terminal N of the fourth inverter IN4 and the junction point q of the series resistances R1 and R2.

Such being the case, the level shift amplifier according to the third embodiment of the present invention has, as illustrated in FIG. 12, a smooth circuit 11 comprising the capacitances C1–C4 and the resistances R1–R4, which is connected to the level shift amplifier according to the first embodiment.

Therefore, with the first capacitance C1 and the first resistance R1 the output voltage of the third inverter IN3 becomes smooth, its output voltage can be supplied to the negative voltage terminal N of the first inverter IN1. Similarly, with the second capacitance C2 and the second resistance R2 the output voltage of the fourth inverter IN4 becomes smooth, its output voltage can be supplied to the negative voltage terminal N of the second inverter IN2.

Further, with the third capacitance C3 and the third resistance R3 the output voltage of the fifth inverter IN5 becomes smooth, its output voltage can be supplied to the negative voltage terminal N of the third inverter IN3. Also, with the fourth capacitance C4 and the fourth resistance R4 the voltage divided by the bias resistances R1 and R2 becomes smooth, its output voltage can be supplied to the negative voltage terminal N of the fourth inverter IN4.

Thereby, the bias voltage supplied to each of the inverters IN1–IN5 is stabilized, and thus a level shift amplifier of high reliability can be composed.

Further, according to each embodiment of the present invention, in case of n=5, i.e. the example that the input signal can be √2 times with the amplifying operation of one step is described, but many other varieties of examples are possible.

For example, with the increase of the number of steps such as n=7, 9 . . . , a level shift amplifier with the capabilities of amplifying operations up to six time, eight times . . . of the input signals can be composed. Thereby, measures can be taken enough against further microminiaturizing the read voltage of memory cell arising from the high integration of semiconductor integrated circuits. Accordingly, all the varieties of examples existing within the true principles and scope of the present invention are to be included in the claim for the patent.

What is claimed is:

1. A level shift amplifier comprising:
    (a) first to n th inverters connected in cascade,
        (1) each positive voltage terminal of the first to n th inverter is connected to a first source line,
        (2) each negative voltage terminal of the first to (n−2)th inverter is connected to output of the second next adjacent inverter respectively,
        (3) the negative voltage terminal of the (n−1)th inverter is connected to a voltage divider receiving output of the n th inverter, and
        (4) the negative voltage terminal of the n th inverter is connected to a second source line; and
    (b) n feedback elements connected between the input and output of each inverter and in cascade to each other.

2. A level shift amplifier according to claim 1, wherein said first to (n−2)th inverters include a low pass filter circuit between the negative voltage terminal and the output of the second next adjacent inverter respectively.

3. A level shift amplifier according to claim 1, wherein said (n−1)th inverter include a low pass filter circuit between the negative voltage terminal and the voltage divider receiving output of the n th inverter.

4. A level shift amplifier according to claim 1, wherein said inverters each include:
    a p type field effect transistor and an n type field effect transistor.

5. A level shift amplifier according to claim 1, wherein said inverters each include:
    a pnp type bipolar transistor and an npn type bipolar transistor.

6. A level shift amplifier comprising:
    (a) a first cascade of first to n th inverters connected in cascade and first inverter receiving a first signal,
        (1) each positive voltage terminal of the first to n th inverter connected to a first source line,
        (2) each negative voltage terminal of the first to (n−2)th inverter is connected to negative voltage terminal of the first to (n−2)th inverter respectively, in which is connected to a voltage divider receiving output of the second next inverter respectively,
        (3) the negative voltage terminal of the (n−1)th inverter is connected to the negative voltage terminal of the (n−1)th inverter which is connected to a voltage divider receiving output of the n th inverter at the positive sequence side and the negative sequence side, and
        (4) the negative voltage terminal the n th inverter at the positive sequence side is connected to the second source line;
    (b) a second cascade of first to n th inverters connected in cascade and first inverter receiving complement of first signal, (1) each positive voltage terminal of the first to n th inverter is connected to the first source line, (2) each negative voltage terminal of the first to (n–2)th inverter is connected to negative voltage terminal of the first to (n–2)th inverter respectively, in which is connected to a part of the output of the second next inverter respectively, (3) the negative voltage terminal of the (n–1)th inverter is connected to the negative voltage terminal of the (n–1)th inverter which is connected to a part of the output of the n th inverter, and (4) the negative voltage terminal of the n th inverter is connected to the second source line;

(c) n pieces of feedback elements are connected between the input and output of each inverter; and (d) n pieces of feedback elements are connected between the input and output of each inverter.

7. A level shift amplifiers according to claim 6, wherein said first to (n–2)th inverters include a low pass filter circuit between the junction of the negative voltage terminal and the voltage divider receiving output of the second next inverter respectively.

8. A level shift amplifier according to claim 6, wherein said (n–1)th inverter includes a low pass filter circuit between the junction of the negative voltage terminal and a part of the output of the n th inverter.

9. A level shift amplifier according to claim 6, wherein each of said inverters include:

p type field effect transistors and n type field effect transistors.

10. A level shift amplifier according to claim 6, wherein each of said inverters include:

pnp type bipolar transistors and npn type bipolar transistors.

* * * * *